United States Patent [19]
Rathbone et al.

[11] 4,048,517
[45] Sept. 13, 1977

[54] LOGIC ELEMENT
[75] Inventors: Ronald Rathbone, Taufkirchen; Peter Rydval, Munich, both of Germany
[73] Assignee: Siemens Aktiengesellschaft, Berlin & Munich, Germany
[21] Appl. No.: 700,734
[22] Filed: June 28, 1976
[30] Foreign Application Priority Data
   July 8, 1975   Germany ................... 2530424
[51] Int. Cl.² ............... H03K 19/22; H03K 19/08
[52] U.S. Cl. .................... 307/213; 307/218; 307/303; 307/317 A; 357/15; 357/50
[58] Field of Search .............. 307/213–215, 307/218, 300, 317 A, 303; 357/15, 50

[56] References Cited
U.S. PATENT DOCUMENTS
3,742,250  6/1973  Kan .................... 307/300 X OTHER PUBLICATIONS
IBM Technical Disclosure Bulletin, vol. 17, No. 2, July 1974, pp. 411–412, "Double Metallization Nonsaturated Schottky Diode Transistor Logic Circuit," by V. L. Gani et al.

Primary Examiner—John Zazworsky
Attorney, Agent, or Firm—Hill, Gross, Simpson, Van Santen, Steadman, Chiara & Simpson

[57] ABSTRACT
A logic element, particularly a bipolar gate circuit for an LSI-circuit, employing a pair of Schottky-diodes, a pair of resistances and a transistor, with the diodes, connected in high resistance direction, to respective inputs, the other sides of the diodes being connected in common to a first resistance and to the base of the transistor, with said first resistance being operatively connected to a reference potential, said second resistance connecting the collector of the transistor, and the common connection of said diodes.

1 Claim, 5 Drawing Figures

LOGIC ELEMENT

BACKGROUND OF THE INVENTION

The invention relates to a logic element, particularly a bipolar gate circuit, for an LSI-circuit, in which one terminal of a first Schottky-diode is connected, in high-resistance direction, to a first input and one terminal of a second Schottky-diode is connected, in high resistance direction, to a second input, with the remaining terminals of the first and second diodes being connected to one terminal of a first resistance and to the base of a transistor, and the second terminal of the first resistance being connected to a reference potential.

A known, high-speed bipolar gate circuit for LSI-circuits employs different Schottky-diodes which are connected to the base terminal of a pnp-transistor, functioning as the current source, and to the base terminal of a Schottky-transistor (see Electronics, December 1974, pp 36 and 38).

The production of so-called C³L-gate circuit (C³L = Complementary Constant Current Logic) is difficult as two technologically different Schottky-diode types as well as one pnp-transistor must be employed. As a result of the different Schottky-diode types required, complex manufacturing processes are involved with relatively poor production efficiency. At the same time, the use of a pnp-transistor as current source involves greater demands on all production steps, again reducing the ultimate production efficiency. Further, the pnp-transistor involves an additional capacitance and poor amplification along with large base currents which do not participate in the switch-over operation. As a result, the use of a pnp-transistors is accompanied by a loss in power and switching time.

In order to achieve a high-speed bipolar gate circuit with relatively simple production operations, high packing density, and good amplification, a logic element, particularly a bipolar gate circuit for LSI-circuits, has already been proposed, in which the logic element has at least two Schottky-diodes in a semiconductor member, in which the Schottky-diodes performing different functions have areas of different efficiency and-/or variable dopings of the semiconductor member beneath the Schottky contacts, for the purpose of effecting a change in the starting voltages.

In such prior bipolar gate circuit, respective Schottky-diodes are connected at their first terminals, in high-resistance direction, to first and second inputs respectively, with the second terminals of the diodes being connected to one end of a resistance, to the terminal of a third Schottky diode, and to the base of a transistor. The second terminal of the resistance was connected to a reference potential and the second terminal of the third Schottky-diode was connected in common to an output and to the collector of a transistor. The Schottky contacts of the first and second diodes exhibited a different surface area or a variable doping of the semiconductor member beneath the Schottky contacts, as compared with the third Schottky-diode.

Such a logic element, particularly a bipolar gate circuit for LSI-circuits, is achieved, which is relatively simple to produce and which exhibits a rapid switching characteristic, together with a high packing density. The technologically different Schottky-diodes are produced either by the employment of Schottky-diodes in the same technology of metallization, with a low starting voltage and different surface area, or by changing the starting voltage by means of variations in the doping of the semiconductor member, for example by means of ion implantation. In addition, the pnp-transistor in the C³L-gate circuit is replaced by a resistance, whereby the switching behavior is even further improved.

In the known C³L-gate circuit and the proposed gate circuit, which is also designated as a S³TL-gate circuit ( = Small Swing Schottky Logic), experiments have shown that the logic swing, i.e. the differential between the operational levels, is relatively small and consequently, with very limited freedom from interference. In addition, Schottky-diodes, particularly with different starting voltages involve a certain risk in production efficiency.

BRIEF SUMMARY OF THE INVENTION

It is the object of the invention to provide a gate circuit of the type above described which enables a favorable adjustability of the logic swing.

In accordance with the invention, this problem is solved by the utilization of a second resistance disposed between the collector of the transistor and the second terminal of the first and second Schottky-diodes.

By replacement of the third Schottky-diode in a S³TL-gate circuit, with a second resistance, an improved adjustability of the logic swing is attained with the aid of the resistance ratio between the first and second resistance with respect to the supply voltage or the supply current. In addition, variations influenced by temperature and production tolerance variation in manufacture may be compensated by means of adjusting the resistance ratio or by supply from a matching current source.

Advantageously, the second terminals of the first and second Schottky-diode are connected to the adjacent terminal of the first resistance over the collector-emitter path of a second transistor.

BRIEF DESCRIPTION OF THE DRAWINGS

In the drawings, wherein like reference characters indicate like or corresponding parts.

DETAILED DESCRIPTION OF THE INVENTION

Figure 1:
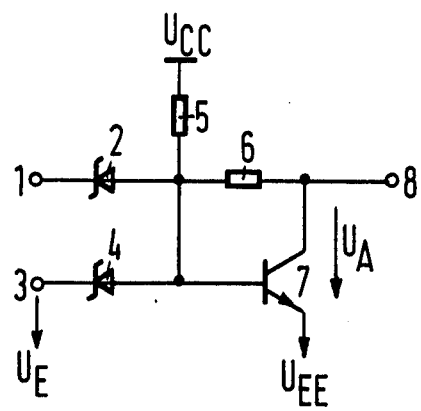
FIG. 1 is a schematic diagram of a bipolar NAND-gate circuit employing two inputs.

Referring to FIG. 1, a first terminal of a first Schottky-diode 2 is connected, in high-resistance-direction, to a first input 1, while a corresponding first input of a second Schottky-diode 4 is connected to a second input 3, with the Schottky-diode 4 likewise being polarized in high-resistance-direction relative to the input 3. The second terminals of the Schottky-diodes 2 and 4 are connected to the first terminal of a feedback-resistance 6, and to the base terminal of a transistor 7. The second terminal of the resistance 5 is connected to a reference potential $U_{CC}$ or to ground, while the second terminal of the resistance 6 is connected to the collector of transistor 7 and to an output 8.

In operation an input voltage $U_E$ is supplied to inputs 1 and 3 and a reference voltage $U_{EE}$, or ground, is supplied to the emitter of transistor 7, while an output voltage $U_A$ is additionally supplied to the output 8. The emitter of transistor 7 may also be connected to a resistance over the collector-emitter-path of a similarly constructed transistor (not illustrated). In use as a C³L-gate circuit, advantageously there is additionally provided a transistor 9, which as illustrated in FIG. 2 has its emitter-collector-path disposed between the adjacent terminal of the resistance 5 and the common connection point of the diodes 2 and 4 and resistance 6 with the base of the transistor 9 being supplied with a voltage $U_{BB}$.

Figure 2:
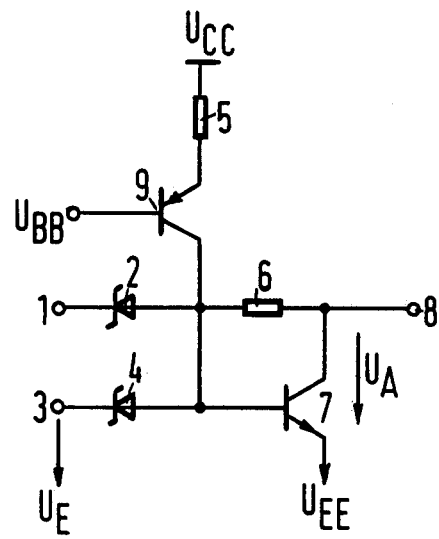
FIG. 2 is a schematic diagram of a similar bipolar NAND-gate circuit with two inputs and employing an additional transistor.

The gate circuits illustrated in FIGS. 1 and 2 satisfy two logic functions, first resistance 5 and the two Schottky-diodes 2 and 4 form an AND-diode linkage, while transistor 7 and resistance 6 form an inverter preventing saturation.

Figure 3:
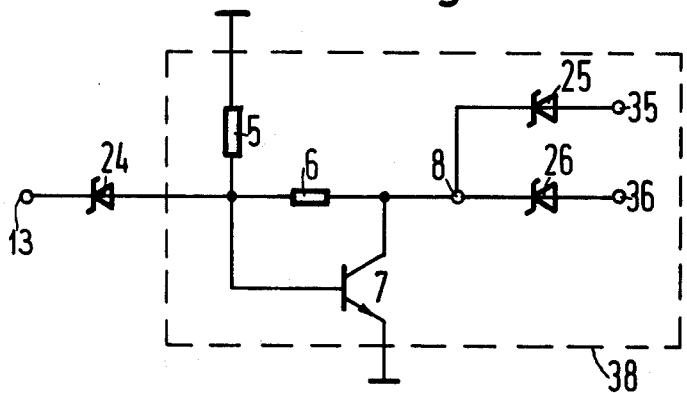
FIG. 3 illustrates the electrical equivalent circuit of a bipolar gate circuit.
Figure 4:
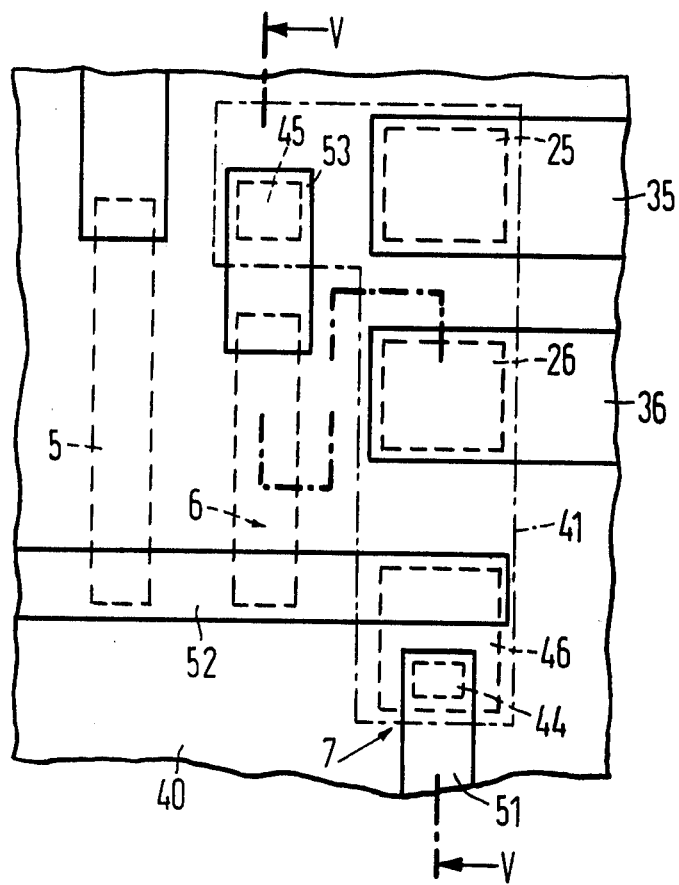
FIG. 4 is a plan view of a semiconductor structure representing that portion of the circuit illustrated in FIG. 3 enclosed by the broken line.

FIG. 3 illustrates the electrical circuit of the bipolar gate circuit illustrated in FIG. 4 in which a Schottky-diode 24 is connected in high-resistance direction to an input 13. Additionally, two Schottky-diodes 25, 26 are provided, connected in high resistance direction at output 8, each of which forms the first Schottky-diode (corresponding to Schottky-diode 24) of a series gate circuit. Schottky diodes 25 and 26 have respective terminals 35 and 36, with the diodes 24, 25 and 26 all being similarly constructed.

Figure 5:
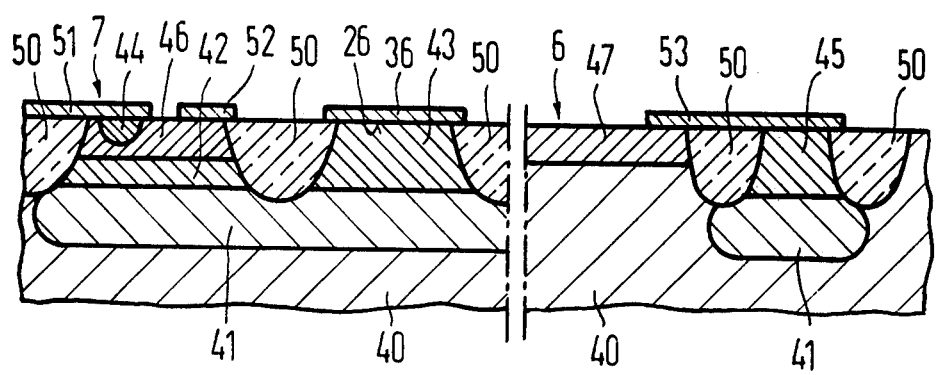
FIG. 5 is a sectional view taken approximately on the line V—V of the structure illustrated in FIG. 4.

Referring to FIGS. 4 and 5, which respectively illustrate plan and sectional views of a semiconductor structure embodying the invention, the p-conductive semiconductor member 40 is provided with an n+-conductive zone (buried layer) 41, on which are disposed n−-conductive zones 42 and 43. Additional zones are provided in the form of n+-conductive zones 44 and 45 and p-conductive zones 46 and 47, with adjacent component elements being insulated by oxide layers 50. Schottky-diode 26 comprises a titanium Schottky contact 36 and zone 43, while the resistance 6 comprises a conductor path 53, zone 47, and conductor path 52. The emitter of transistor 7 is formed by zone 44 which is connected to a conductor path 51, zone 46 forming the base and zone 42 forming the collector of the transistor, with the latter zone being connected to zone 45 over a zone 41, the zone 45 being contacted by a conductor path 53.

The logic element in accordance with the invention is particularly suitable as a high speed bipolar gate circuit (LSI-circuits). For this purpose, a plurality of circuits, such as those illustrated in FIGS. 1 and 2 may then be connected in series whereby output 8 and the emitter of transistor 7 form the input for the next element, and in which the emitter is charged with the voltage $U_{EE}$.

Having thus described our invention it will be obvious that although various minor modifications might be suggested by those versed in the art, it should be understood that we wish to embody within the scope of the patent granted hereon all such modifications as reasonably, and properly come within the scope of our contribution to the art.

We claim as our invention:

1. A logic element, particularly a bipolar gate circuit for an LSI-circuit, comprising a pair of Schottky-diodes, a pair of resistances and a transistor, a first input to which a terminal of a first of said diodes is connected in high resistance direction, a second input to which a terminal of the second of said diodes is connected in high-resistance direction, the second terminals of said diodes being connected to one terminal of a first resistance and to the base of said transistor, the other terminal of said first resistance being connected to a reference potential, said second resistance having one terminal connected to the collector of said transistor, and the other terminal thereof, being connected to the second terminal of said diodes, and a second transistor having its emitter-collector path operatively disposed between the second terminal of said diodes and the associated terminal of the first resistance.

* * * * *